(12) United States Patent
Fairgrieve

(10) Patent No.: US 7,106,769 B2
(45) Date of Patent: Sep. 12, 2006

(54) ADJUSTABLE POWER CONTROL FOR LASER DRIVERS AND LASER DIODES

(75) Inventor: Alexander Fairgrieve, Menlo Park, CA (US)

(73) Assignee: Elantec Semiconductor, Inc., Milpitas, CA (US)

( * ) Notice: Subject to any disclaimer, the term of this patent is extended or adjusted under 35 U.S.C. 154(b) by 255 days.

(21) Appl. No.: 10/772,051

(22) Filed: Feb. 4, 2004

(65) Prior Publication Data

US 2004/0202216 A1    Oct. 14, 2004

Related U.S. Application Data

(60) Provisional application No. 60/461,733, filed on Apr. 9, 2003.

(51) Int. Cl.
*H01S 3/00* (2006.01)
(52) U.S. Cl. .................. 372/38.04; 372/38.07
(58) Field of Classification Search ............. 372/38.04, 372/38.07
See application file for complete search history.

(56) References Cited

U.S. PATENT DOCUMENTS 5,414,280 A * 5/1995 Girmay .................. 257/80

6,255,707 B1   7/2001 Bylsma et al.
6,807,202 B1   10/2004 Plamper et al.

FOREIGN PATENT DOCUMENTS

| EP | 1 039 597 A2 | 9/2000 |
| WO | WO 02/13340 A2 | 2/2002 |
| WO | PCT/US2004/008320 | 12/2004 |

* cited by examiner

*Primary Examiner*—Armando Rodriguez
(74) *Attorney, Agent, or Firm*—Fliesler Meyer LLP

(57) ABSTRACT

Methods and systems and apparatuses for reducing power consumption, in an environment including a laser driver that drives a laser diode, are provided. The voltage drop across a laser diode, driven by a laser driver, is monitored. This enables a supply voltage, used to power the laser driver, to be appropriately adjusted, based at least in part on the monitored voltage drop. For example, the supply voltage is increased when the monitored voltage drop across the laser diode increases, and decreased when the monitored voltage drop across the laser diode decreases.

23 Claims, 4 Drawing Sheets

ADJUSTABLE POWER CONTROL FOR LASER DRIVERS AND LASER DIODES

PRIORITY CLAIM

This application claims priority under 35 U.S.C. 119(e) to U.S. Provisional Patent Application No. 60/461,733, filed Apr. 9, 2003, entitled "ADJUSTABLE POWER CONTROL FOR LASER DRIVERS AND LASER DIODES," which is incorporated herein by reference.

FIELD OF THE INVENTION

The present invention relates to laser drivers, and more particularly to reducing power consumption in an environment including a laser driver that drives a laser diode.

BACKGROUND OF THE INVENTION

In the field of optical data storage, a laser driver drives a current through a laser diode to cause it to emit light. When current is flowing to produce light, there is a voltage drop across the laser diode. In optical data storage applications, the desire for faster writing speeds and higher storage densities has resulted in laser diodes that drop a substantial forward voltage when operating at their peak current values. This forward laser diode drop will only increase as shorter wavelength laser diodes are introduced into the marketplace.

Unfortunately, most electronic systems run off standardized voltage supplies, which rarely change due to the large legacy of silicon components already designed to operate at these voltages. Since the laser diode is designed to achieve certain optimum performance characteristics without regard to supply voltage standards, the resulting laser diodes can have voltage requirements that make it very difficult to design laser drivers without certain compromises. The primary requirement is that the laser driver should be able to drive all the laser diodes supplied by vendors for a given application. When worst case forward voltage drop is taken into consideration, it may not be possible to drive such laser diodes with standard supply voltages, such as 3.3V or 5.0V. Since optical data storage applications usually exist in a personal computer (pc) environment, the supply voltages are generally fixed and limited, and often with a poor tolerance.

Even when a custom voltage supply is added, worst case analysis results in operation at a higher supply voltage than the laser diode typically requires, causing excess power dissipation. In a battery based environment such as laptop computers, this is highly undesirable.

Accordingly, there is a need to overcome the above discussed problems and disadvantages.

SUMMARY OF PRESENT INVENTION

Embodiments of the present invention relate to systems and methods for reducing power consumption in an environment including a laser driver that drives a laser diode. Embodiments of the present invention also relate to laser drivers that incorporate power saving features. In accordance with an embodiment of the present invention, the voltage drop across a laser diode, driven by a laser driver, is monitored. This enables a supply voltage, used to power the laser driver, to be appropriately adjusted, based at least in part on the monitored voltage drop. For example, the supply voltage is increased when the monitored voltage drop across the laser diode increases, and decreased when the monitored voltage drop across the laser diode decreases.

In a typical optical drive, there are usually two modes of operation, read and write. In read mode, the laser current is relatively constant, allowing for a low frequency scheme to be used to monitor the voltage drop across the laser diode. For example, in accordance with an embodiment of the present invention most useful during read mode, the voltage drop across the laser diode is monitored using a high impedance filter (e.g., an RC filter) connected to a cathode of the laser diode, to produce a feedback path. This feedback path can be provided to a controller that, for example, measures the voltage drop across the laser diode. In write mode, sampling schemes are better suited for monitoring the laser diode voltage drop, because laser current pulses are so short lived. More specifically, in accordance with an embodiment of the present invention, a sampler is used to sample the voltage drop across the laser diode. Such samples can be measured to determine the instantaneous voltage drop and/or the peak voltage drop over a period of time. Such peak voltage determinations can be determined periodically or aperiodically. Such sampling embodiments are useful in both write mode and read mode.

In accordance with an embodiment of the present invention, the supply voltage is adjusted based on at least both the monitored voltage drop across the laser diode and a laser driver headroom voltage. The laser driver headroom voltage is equal to at least a minimal additional voltage necessary to operate the laser driver. The laser driver headroom voltage can be treated as a constant, or it can be treated as a variable. For example, a laser driver can determine its own laser driver headroom voltage in real time. A desired supply voltage can then be determined by adding the monitored voltage drop to the laser driver headroom voltage. It is also possible (though, not necessary) to add a small cushion voltage, if desired. The supply voltage can then be adjusted to generally track the desired supply voltage.

In accordance with an embodiment of the present invention, a laser driver includes an integrated sampler that is used to sample the voltage drop across the laser diode. The laser driver can also includes a controller that determines desired supply voltage information based on the laser driver headroom voltage and the voltage samples produced by the sampler. In alternative embodiments of the present invention, the sampler and/or the controller are external to the laser driver. The desired supply voltage information determine by the controller may include desired supply voltage values. Alternatively, the desired supply voltage information may be requests for increasing or decreasing an actually supply voltage. Such information can be provided to a further controller associated with the power supply, thereby allowing the further controller to appropriately adjust the supply voltage.

Further embodiments, and the features, aspects, and advantages of the present invention will become more apparent from the detailed description set forth below, the drawings and the claims.

DETAILED DESCRIPTION

Figure 1:
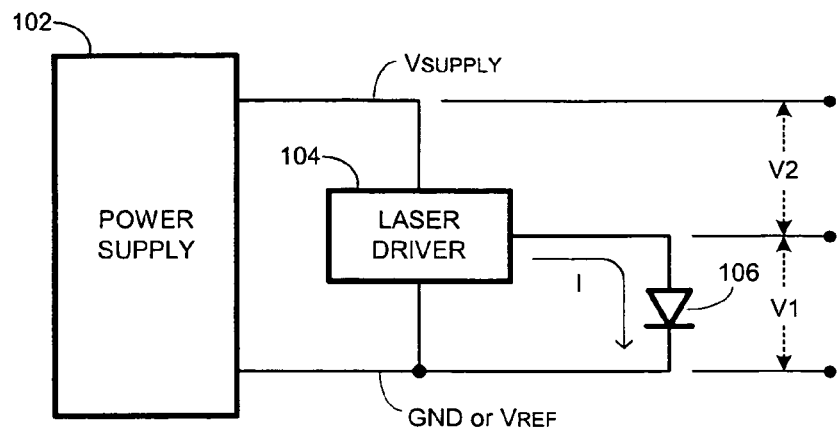
FIG. 1 shows a conventional system including a power supply providing a fixed supply voltage, a laser driver and a laser diode.

FIG. 1 shows a convention power supply 102 that outputs a fixed supply voltage ($V_{SUPPLY}$). The fixed supply voltage is used to power a laser driver 104, which in turn drives a laser diode 106 with a drive current (I). The voltage drop across the laser diode 106, also known as the laser diode forward voltage, is shown as V1. An additional voltage, used to power the laser driver 104 is shown as V2. As can be seen from FIG. 1, $V_{SUPPLY}$=V1+V2.

As mentioned above, even when a custom power supply 102 is used to power the laser driver 104, worst case analysis results in operation at a higher supply voltage than the typical laser diode 106 typically requires, causing excess power dissipation. It would be much better to use a power supply that is adjustable to suit the needs of each laser diode. However, even then, a factory set supply is only a partial solution, since a laser diode's forward voltage changes with time and temperature, as described below with reference to FIG. 2. Thus, if the supply voltage were set in the factory, worst case analysis would still require that a higher voltage than typically necessary be used.

Figure 2:
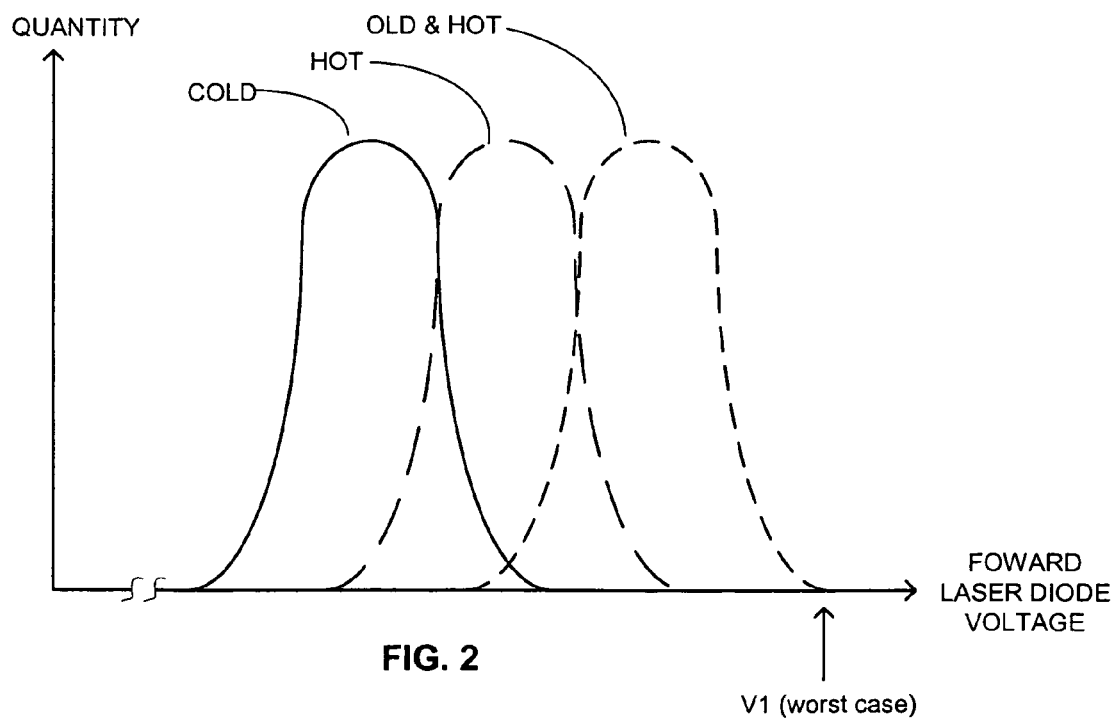
FIG. 2 shows characteristics of an exemplary population of laser diodes.

FIG. 2 shows exemplary characteristics of a population of laser diodes that each have the same model number. A vendor may provide a similar figure as one of the data sheets describing the laser diodes. Each bell shaped curve in the figure shows the distribution of voltage drops (V1) for the population of laser diodes. As can be seen in FIG. 2, the laser diode forward voltage (V1) for the laser diodes is dependent on the temperature and age of the laser diodes. More specifically, as a laser diode increases in temperature, the laser diode forward voltage drop typically increases. Further, as a laser diode increases in age, the laser diode forward voltage drop also typically increases. Therefore, the worst case laser diode forward voltage is typically that of an aged (i.e., old) and hot laser diode, as shown in FIG. 2. Thus, if the supply voltage ($V_{SUPPLY}$) is set with the worst case laser diode forward voltage in mind, significant power will be wasted when the laser diode is relatively young (i.e., new) and/or cold. In other words, setting the supply voltage ($V_{SUPPLY}$) to provide for the worst case laser diode forward voltage will cause significant power to be wasted when the laser diode has not yet reached the worst case (which it may not ever reach).

In accordance with embodiments of the present invention, a supply voltage that varies in real time according to the real time voltage requirements of the laser diode is used to provide optimal power consumption (i.e., minimum power consumption). As will be explained in more detail below, embodiments of the present invention measure the forward voltage drop of a laser diode during peak current (and hence peak voltage) events, to thereby control a power supply to provide the minimal (or close to minimal) voltage necessary for the laser driver to drive the laser diode.

Embodiments of the present invention accomplish accurate power control by monitoring the laser diode forward voltage (V1) in real time. An additional voltage (V2), which is required to reliably power the laser driver, is added to V1. Then the voltage supply is controlled to supply this minimum value of voltage that will minimize power consumption.

Figure 3:
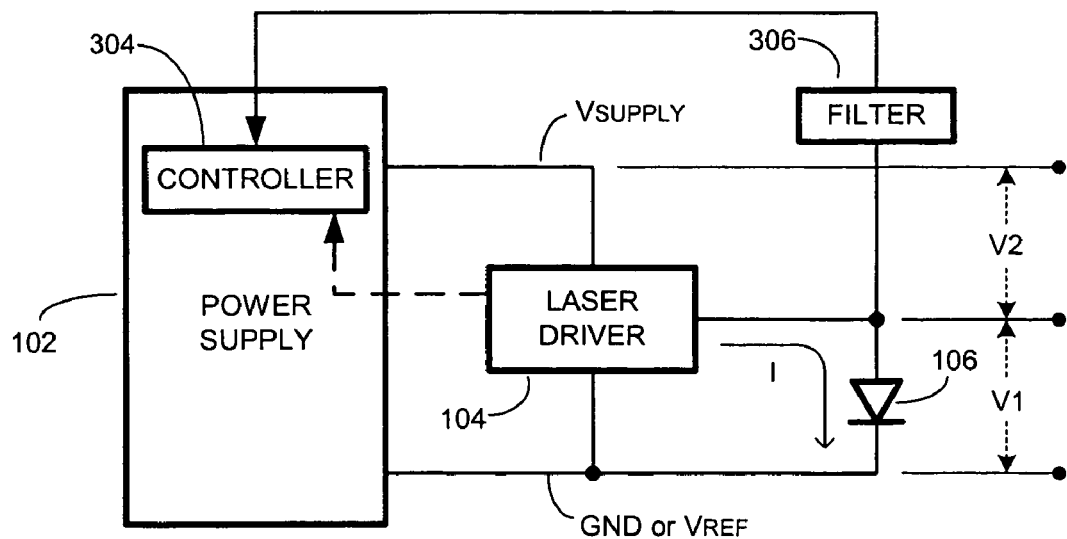
FIG. 3 shows a high level diagram of an embodiment of the present invention.

FIG. 3 shows a general system level solution, according to an embodiment of the present invention. For reasons explained below, the embodiment of FIG. 3 will work well when a laser driver is in read mode (also known as playback), during which the laser diode forward voltage (V1) is relatively constant. In this embodiment, the laser diode forward voltage (V1) is monitored, for example, through a filter 306 (e.g., a simple high impedance RC filter), and fed back to a controller 304. The controller 304 is shown as being associated with (e.g., within or external to) the power supply 102. In accordance with an embodiment of the present invention, based at least in part on the monitored laser diode forward voltage (V1), the controller 304 determines the appropriate voltage supply (e.g., the minimum voltage supply) to provide to the laser driver 104. Besides the voltage (V1) across the laser diode 106, the laser driver requires an additional voltage (V2) to operate, as discussed above with reference to FIG. 1. This additional voltage (V2) is also referred to as the laser driver headroom voltage. The additional voltage (V2) will not significantly vary over time, since the characteristics of the components that make up the laser driver do not significantly change with age or temperature. Accordingly, the headroom voltage (V2) can be treated as a constant (but need not be, if further optimization is desired). In contrast, as stated above, the characteristics of the laser diode 106 do significantly change with age and temperature.

In accordance with an embodiment of the present invention, the controller 304 determines the voltage supply ($V_{SUPPLY}$) by adding the monitored laser diode forward voltage (V1) to a fixed laser driver headroom voltage (V2). In accordance with an alternative embodiment of the present invention, the laser driver 104 notifies the controller 304 of the amount of additional voltage (V2) that it needs to operate. In each of the above described embodiments, the voltage supply ($V_{SUPPLY}$) provided to the laser driver 104 varies in real time, to optimize power consumption.

Figure 4:
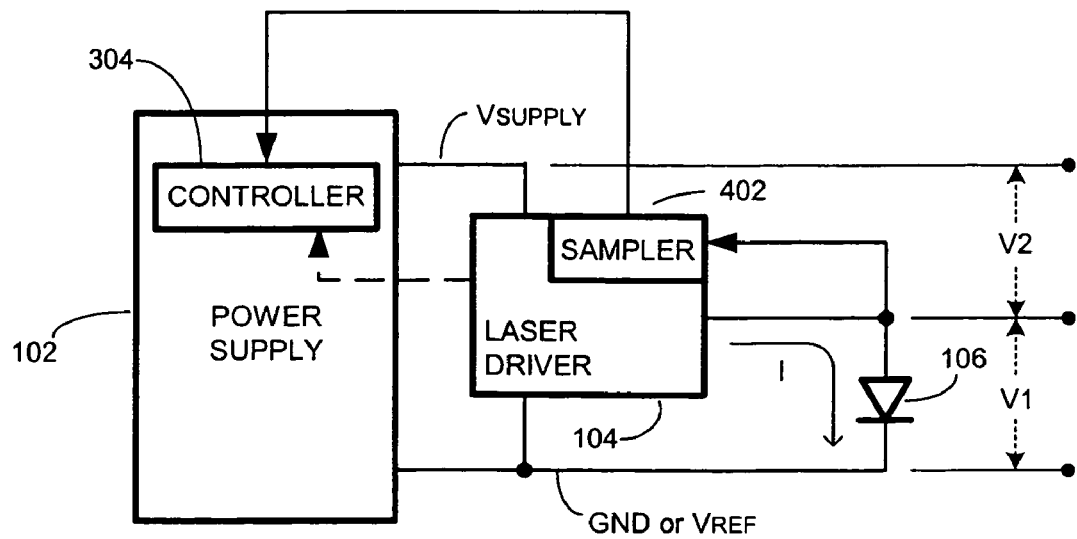
FIG. 4 shows a high level diagram of another embodiment of the present invention.

During write mode, the waveform of the drive current (I), provided by the laser driver 104 to the laser diode 106, rapidly changes over time due to the various write strategies that are used to write various marks onto a disk surface. FIG. 4 shows an embodiment of the present invention that is useful for a storage device that performs write functions and read functions. The laser driver 104, which includes a sampler 402 in this embodiment, samples the laser diode forward voltage (V1) across the laser diode 106 to thereby determine the peak laser diode forward voltage (V1). The laser driver 104 informs the controller 304 of the peak laser diode forward voltage (V1). Alternatively, the laser driver 104 provides the samples to the controller 304, and the controller 304 determines the peak laser diode forward voltage (V1). Then the controller 304 either adds a fixed additional voltage (V2), or a time varying additional voltage (V2), to the peak laser diode forward voltage (V1) to determine the voltage supply ($V_{SUPPLY}$) to provide to the laser driver 104. The controller 304 can gradually adjust the voltage supply to move toward a desired voltage supply, or it can adjust the voltage more abruptly to equal the desired voltage supply.

There are cost and space saving advantages to having the sampler integrated into the laser driver. However, in an alternative embodiment, the sampler 402 is external to the laser driver. For example, the sampler 402 can be part of a dedicated sampling circuit, or part of another integrated circuit (i.e., other than the laser driver integrated circuit).

The peak laserdiode forward voltage (V1) is most likely determined for a period of time, which may or may not be predetermined. During write mode, the drive current waveform output by the laser driver 104 (and provided to the laser diode 106) typically varies, for example, on the order of nanoseconds. Accordingly, a peak laser diode forward voltage (V1) may be determined periodically (e.g., once each microsecond period) or aperiodically (since the sampling can be erratic). Over the short term, this allows the voltage supply (VSUPPLY) to be appropriately adjusted as the laser diode 106 changes in temperature. Over the long term, this also allows the voltage supply (VSUPPLY) to be adjusted as the laser diode 106 ages. It is noted that the above timing has been presented as an example, and is not meant to be limiting.

The controller 304 has been described as being associated with the power supply 102. Alternatively, or additionally, a controller can be associated with the laser driver 104. Such a controller can calculate the desired voltage supply and provide voltage supply information (e.g., commands or requests) to the power supply 102 (or to the controller 304 associated with the power supply). Thus, it is possible that a controller in the laser driver 104 analyzes the voltage drop (V1) across the laser diode 106. Such a controller can, for example, receive a voltage signal from filter 306 or voltage samples from sampler 402.

Figure 5:
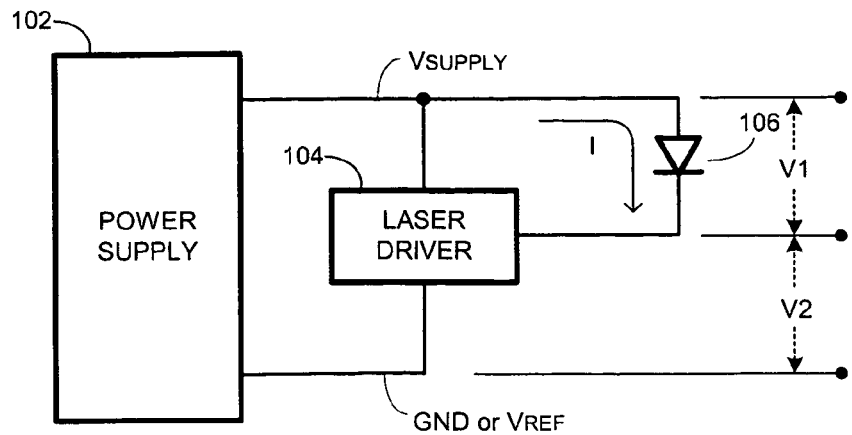
FIG. 5 shows an alternative system including a power supply providing a fixed supply voltage, a laser driver and a laser diode.
Figure 6:
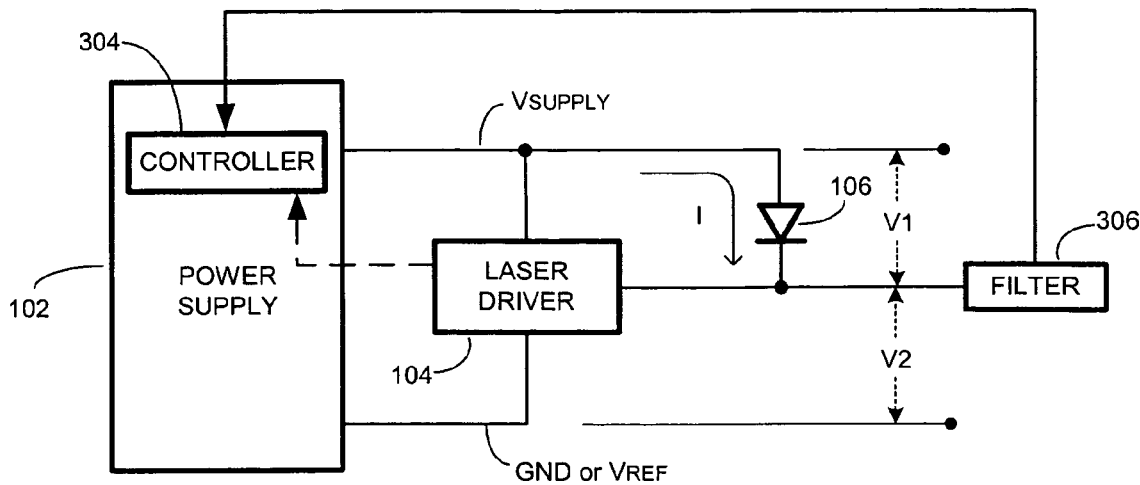
FIG. 6 shows a high level diagram of an embodiment of the present invention.
Figure 7:
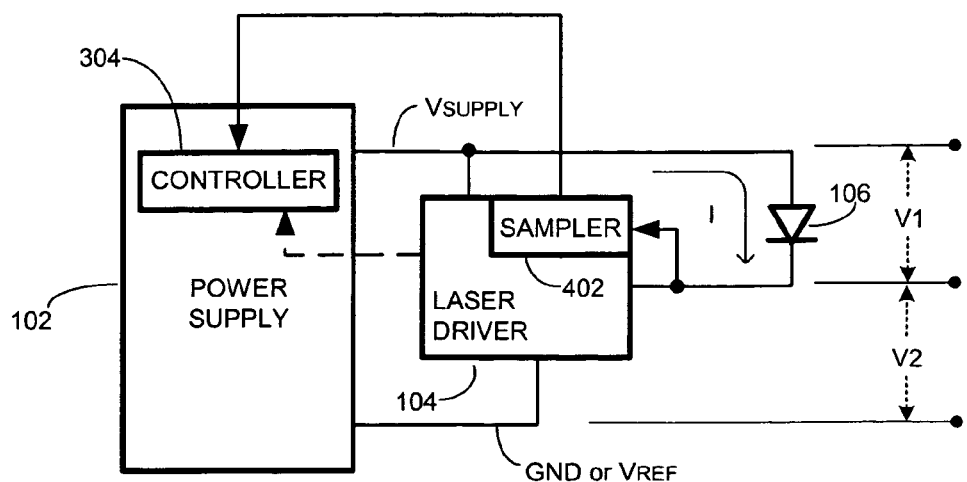
FIG. 7 shows a high level diagram of another embodiment of the present invention.

FIGS. 1, 3 and 4 show configurations where the cathode of the laser diode 106 is connected to the output of the laser driver 104, and the anode of the laser diode 106 is connected to ground or a reference voltage. In such configurations the laser driver 104 can be thought of as "pushing" the drive current through the laser diode 106. However, the embodiments of the present invention will also work with configurations where the cathode of the laser diode 106 is connected to VSUPPLY and the anode of the laser diode is connected to the output of the laser driver 104, as shown in FIGS. 5–7. In such configurations, the laser driver 104 can be thought of as "pulling" the drive current through the laser diode 106. In either configuration, the laser driver 104 is driving the laser diode 106; and the laser diode 106 is receiving a drive current from the laser driver 104.

Figure 8:
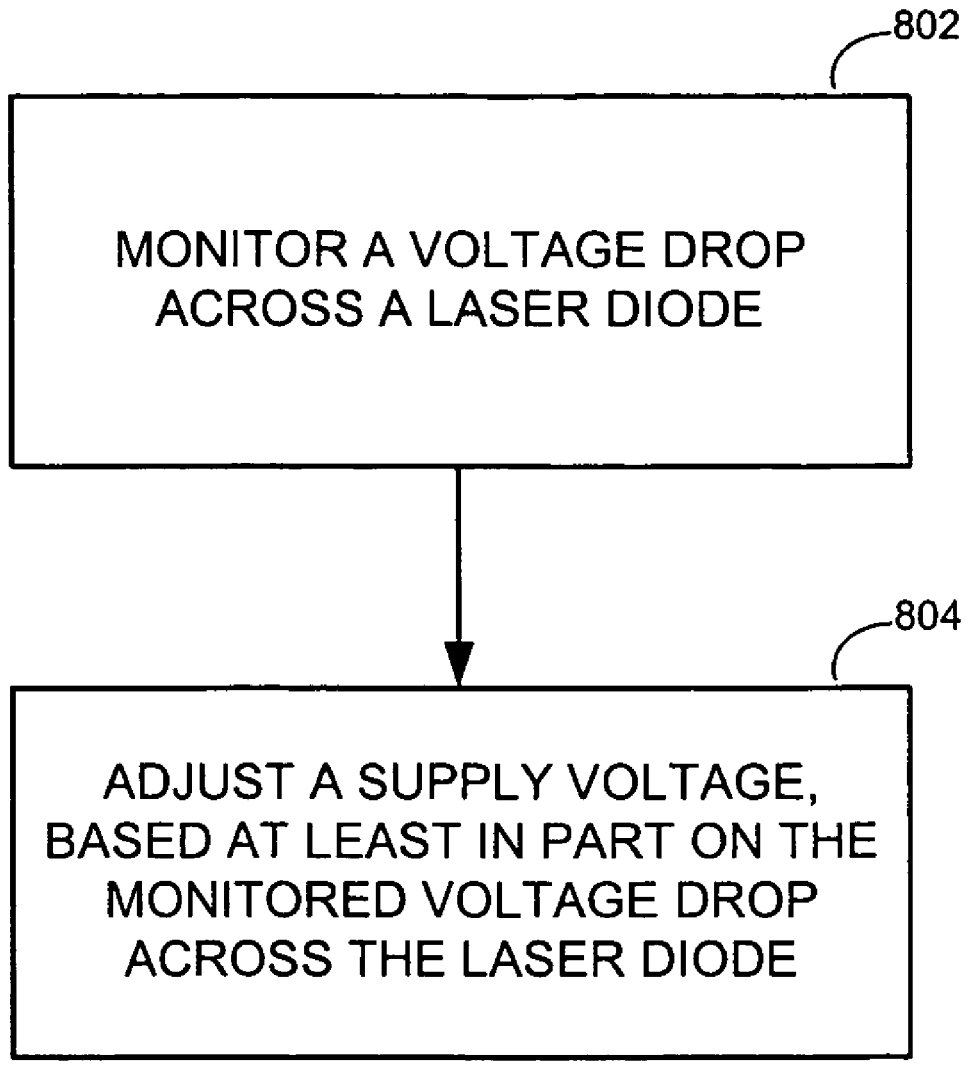
FIG. 8 shows a high level flow diagram that is useful for summarizing certain methods of the present invention.

Methods of the present invention are now summarized with reference to FIG. 8. At a first step 802, the voltage drop across the laser diode 106 is monitored. As was discussed above with reference to FIGS. 3 and 6, this can be accomplished using a high impedance filter (e.g., filter 306) to produce a feedback path that enables the monitoring of the voltage drop across the laser diode 106. As was discussed above with reference to FIGS. 4 and 7, this can alternatively be accomplished by sampling the voltage drop across the laser diode 106 (e.g., using the sampler 402). One of ordinary skill in the art will understand that there are further techniques for monitoring the voltage drop across the laser diode 106 that are within the spirit and scope of the present invention.

At a next step 804, the supply voltage is adjusted, based at least in part on the monitored voltage drop across the laser diode 106. This can include increasing the supply voltage when the monitored voltage drop increases, and decreasing the supply voltage when the monitored voltage drop decreases. In accordance with an embodiment of the present invention, the supply voltage is adjusted to track a desired supply voltage, where the desired supply voltage is determined based on at least both the monitored voltage drop across the laser diode 106 and a laser driver headroom voltage, as explained in more detail above.

The above described embodiments enable the real time control of a laser driver supply voltage to meet the real time supply voltage requirements of the laser driver. This enables minimum (or close to minimum) power dissipation to be achieved.

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of functional building blocks illustrating the performance of specified functions and relationships thereof. The boundaries of these functional building blocks have often been arbitrarily defined herein for the convenience of the description. Unless otherwise specified, alternate boundaries can be defined so long as the specified functions and relationships thereof are appropriately performed. Any such alternate boundaries are thus within the scope and spirit of the claimed invention.

The breadth and scope of the present invention should not be limited by any of the above-described exemplary embodiments, but should be defined only in accordance with the following claims and their equivalents.

What is claimed is:

1. For use in a system including a power supply that provides a supply voltage to a laser driver, and a laser diode that receives a drive current from the laser driver, a method for reducing power consumption, comprising:
    (a) monitoring a voltage drop across the laser diode; and
    (b) adjusting the supply voltage, based at least in part on the monitored voltage drop across the laser diode, wherein said adjusting includes increasing the supply voltage when the monitored voltage drop across the laser diode increases, and decreasing the supply voltage when the monitored voltage drop across the laser diode decreases.

2. The method of claim 1, wherein step (a) includes using a high impedance filter to produce a feedback path that enables the monitoring of the voltage drop across the laser diode.

3. The method of claim 1, wherein step (a) includes sampling the voltage drop across the laser diode.

4. For use in a system including a power supply that provides a supply voltage to a laser driver, and a laser diode that receives a drive current from the laser driver, a method for reducing power consumption, comprising:
    (a) monitoring a voltage drop across the laser diode;
    (b) determining a desired supply votage, based on at least both the monitored voltage drop across the laser diode and a laser driver headroom voltage, the laser driver headroom voltage being at least a minimal additional voltage necessary to operate the laser driver; and
    (c) adjusting the supply voltage to generally track the desired supply voltage.

5. The method of claim 4, wherein the desired supply voltage, determined at step (b), is substantially equal to the monitored voltage drop plus the laser driver headroom voltage.

6. The method of claim 5, wherein the laser driver headroom voltage is treated as a constant.

7. The method of claim 5, wherein the laser driver headroom voltage varies.

8. The method of claim 5, wherein step (b) includes:
determining a peak monitored voltage drop across the laser diode over a period of time; and
determining the desired supply voltage by adding the peak monitored voltage drop to the laser driver headroom voltage.

9. A laser driver adapted to drive a laser diode, comprising:
a sampler to sample a voltage drop across the laser diode; and
a controller to determine desired supply voltage information based on at least both a laser driver headroom voltage and voltage samples produced by the sampler;
wherein the controller also provides the desired supply voltage information to either a power supply that produces an actual supply voltage used to power the laser driver, or to a further controller associated with the power supply.

10. A systyem, comprising:
a laser driver adapted to drive a laser diode;
a sampler to sample a voltage drop across the laser diode; and
a controller to adjust a supply voltage, used to power the laser driver, based at least in part on voltage drop samples produced by the sampler, wherein the controller increases the supply voltage when the voltage drop samples are indicative of an increase in the voltage drop across the laser diode, and the controller decreases the supply voltage when the voltage drop samples are indicative of a decrease in the voltage drop across the laser diode.

11. A system, comprising:
a laser driver adapted to drive a laser diode;
a sampler to sample a voltage drop across the laser diode; and
a controller to adjst a supply voltage, used to power the laser driver, based on at least both a laser driver headroom voltage and voltage drop samples produced by the sampler, to substantially minimize the amount of power consumed by the laser driver and the laser diode.

12. The system of claim 11, wherein the laser driver headroom voltage comprises a predetermined estimate.

13. The system of claim 11, wherein the laser driver headroom voltage is adjusted in real time.

14. A system, comprising:
a laser driver adapted to drive a laser diode;
means for monitoring a voltage drop across the laser diode; and
means for adjusting a supply voltage, used to power the laser driver, based at least in part on the monitored voltage drop across the laser diode;
further comprising a means for monitoring a laser driver headroom voltage.

15. The system of claim 14, wherein the means for adjusting the supply voltage based on at least both the monitored voltage drop and the monitored laser driver headroom voltage.

16. A system, comprising:
a laser driver adapted to drive a laser diode; and
a controller to monitor a voltage drop across the laser diode and to determine a desired supply voltage based at least in part on the monitored voltage drop;
wherein the controller also adjusts a supply voltage, which powers the laser driver, to track the desired supply voltage.

17. The system of claim 16, further comprising a high impedance filter connected between the laser diode and the controller, to provide a feedback path that enables the controller to monitor the voltage drop across the laser diode.

18. The system of claim 16, wherein the controller also determines the desired supply voltage based at least in part on a laser driver headroom voltage, which is at least a minimal additional voltage necessary to operate the laser driver.

19. The system of claim 18, wherein the laser driver headroom voltage is treated as a constant.

20. The system of claim 18, wherein the laser driver headroom voltage varies.

21. For use in a system including a power supply that provides a supply voltage to a laser driver, and a laser diode that receives a drive current from the laser driver, a method for reducing power consumption, comprising:
(a) monitoring a voltage drop across the laser diode;
(b) determining a desired supply voltage to be provided to the laser driver, based on at least in part on the monitored voltage drop across the laser diode; and
(c) adjusting the supply voltage to generally track the desired supply voltage.

22. The method of claim 21, wherein step (b) includes:
determining a peak monitored voltage drop across the laser diode; and
determining the desired supply voltage by adding the peak monitored voltage drop to a laser driver headroom voltage.

23. The system of claim 9, wherein the controller determines a peak monitored voltage drop across the laser diode over a period of time, and determines the desired supply voltage by adding the peak monitored voltage drop to the laser driver headroom voltage.

* * * * *